United States Patent
Rothe et al.

(10) Patent No.: US 9,812,600 B2
(45) Date of Patent: Nov. 7, 2017

(54) USE OF UV-RADIATION-HARDENABLE POLYURETHANE RESINS FOR PRODUCING SOLAR LAMINATES

(71) Applicant: BAYER INTELLECTUAL PROPERTY GMBH, Monheim (DE)

(72) Inventors: Bernd Rothe, Köln (DE); Jens Geschke, Krefeld (DE); Dirk Achten, Leverkusen (DE); Helmut Kuczewski, Kamp-Lintfort (DE); Wolfgang Fischer, Meerbusch (DE)

(73) Assignee: Covestro Deutschland AG, Leverkusen (DE)

( * ) Notice: Subject to any disclaimer, the term of this patent is extended or adjusted under 35 U.S.C. 154(b) by 424 days.

(21) Appl. No.: 14/387,576

(22) PCT Filed: Mar. 25, 2013

(86) PCT No.: PCT/EP2013/056310
§ 371 (c)(1),
(2) Date: Sep. 24, 2014

(87) PCT Pub. No.: WO2013/144095
PCT Pub. Date: Oct. 3, 2013

(65) Prior Publication Data
US 2015/0047705 A1    Feb. 19, 2015

(30) Foreign Application Priority Data
Mar. 27, 2012  (EP) ..................... 12161382

(51) Int. Cl.
| | | |
|---|---|---|
| *B32B 38/00* | (2006.01) |
| *H01L 31/048* | (2014.01) |
| *B32B 17/10* | (2006.01) |
| *B32B 37/02* | (2006.01) |
| *B32B 37/10* | (2006.01) |
| *B32B 37/12* | (2006.01) |
| *B32B 37/16* | (2006.01) |
| *C09J 175/14* | (2006.01) |

(52) U.S. Cl.
CPC .... *H01L 31/0481* (2013.01); *B32B 17/10018* (2013.01); *B32B 17/1077* (2013.01); *B32B 17/10706* (2013.01); *B32B 37/02* (2013.01); *B32B 37/1018* (2013.01); *B32B 37/12* (2013.01); *B32B 37/16* (2013.01); *B32B 38/0008* (2013.01); *C09J 175/14* (2013.01); *B32B 2307/20* (2013.01); *B32B 2307/40* (2013.01); *B32B 2309/68* (2013.01); *B32B 2310/0806* (2013.01); *B32B 2398/00* (2013.01); *B32B 2457/12* (2013.01); *Y02E 10/50* (2013.01)

(58) Field of Classification Search
CPC ........ B32B 17/10706; B32B 17/10018; B32B 17/1077; B32B 38/0008; B32B 37/16; B32B 37/12; B32B 37/1018; B32B 37/02
See application file for complete search history.

(56) References Cited

U.S. PATENT DOCUMENTS

| | | | |
|---|---|---|---|
| 4,331,494 A | | 5/1982 | Duchateau et al. |
| 4,374,995 A | | 2/1983 | Kleemann et al. |
| 4,549,033 A | | 10/1985 | Avenel et al. |
| 4,953,577 A | | 9/1990 | Marshall |
| 6,191,181 B1 | | 2/2001 | Weikard et al. |
| 6,320,116 B1 | | 11/2001 | Hanoka |
| 6,653,394 B1 | * | 11/2003 | Meisenburg ........ C08G 18/0823 522/90 |
| 1,120,546 A1 | | 5/2011 | Nesbitt et al. |
| 8,034,455 B2 | * | 10/2011 | Wang .................. B05D 7/58 428/423.3 |
| 2003/0036620 A1 | | 2/2003 | Kawanabe et al. |
| 2011/0214717 A1 | * | 9/2011 | Halahmi ............ B32B 17/10036 136/251 |
| 2011/0232748 A1 | * | 9/2011 | Shimizu ............ H01L 31/02013 136/256 |

FOREIGN PATENT DOCUMENTS

| | | |
|---|---|---|
| DE | 19855146 A1 | 5/2000 |
| EP | 0406814 A2 | 1/1991 |
| EP | 1002818 A1 | 5/2000 |
| JP | 2011068839 A | 4/2011 |
| JP | 2011071387 A | 4/2011 |
| JP | 2011071447 A | 4/2011 |
| WO | WO-2005006451 A1 | 1/2005 |
| WO | WO-2009007786 A2 | 1/2009 |

OTHER PUBLICATIONS

International Search Report for PCT/EP2013/056310 dated Jun. 28, 2013.

* cited by examiner

*Primary Examiner* — Daniel McNally
(74) *Attorney, Agent, or Firm* — John E. Mrozinski, Jr.

(57) ABSTRACT

The present invention relates to the use of a radiation-hardenable resin composition for producing solar laminates, a method for creating a solar laminate using the resin composition according to the invention, and a solar laminate that can be produced using this method.

18 Claims, No Drawings

USE OF UV-RADIATION-HARDENABLE POLYURETHANE RESINS FOR PRODUCING SOLAR LAMINATES

CROSS-REFERENCE TO RELATED APPLICATIONS

This application is a national stage application (under 35 U.S.C. §371) of PCT/EP2013/056310, filed Mar. 25, 2013, which claims benefit of European Application No. 12161382.2, filed Mar. 27, 2012, both of which are incorporated herein by reference in their entirety.

The present invention relates to the use of a radiation-curable resin composition for the production of solar laminates, to a process for the production of a solar laminate with the aid of the resin composition of the invention, and also to a solar laminate which can be produced by said process.

Solar cells or photovoltaic systems involve semiconductors, which are used to convert light into electricity. The general term solar cells is used hereinafter to describe these. Typically, irradiation of solar cells with light generates a potential difference between opposite ends of the solar cell, this resulting from flow of electrons generated by the irradiation. The magnitude of the potential depends on the intensity of the light incident on the solar cell.

Solar cells can be produced from semiconductor materials of various types, for example from monocrystalline or polycrystalline silicon, or as thin-layer cells from amorphous or semicrystalline silicon, gallium arsenide, copper indium diselenide, cadmium telluride, copper indium gallium diselenide, or a mixture, of these.

In principle, a distinction is made between two different types of solar cells, namely waver-based solar cells on the one hand and thin-film solar cells on the other. A waver is a thin layer of semiconducting material which is cut from a monocrystalline or polycrystalline cylinder via a sawing process. In contrast to this, thin-layer solar cells are based on layers of a semiconductor material deposited on a substrate, the deposition method here being by way of example sputtering, PVD (physical vapor deposition), CVD (chemical vapor deposition), or similar techniques.

Irrespective of the production method, both waver-based and thin-layer-based solar cells have low mechanical strength and are therefore combined with a backing layer for use as solar cells. Said backing layer, which for mechanical stiffening (e.g. reducing the risk of adverse effects of bending or of impact), can be a rigid material, for example a glass plate, or a flexible material, such as a metallic film or layers made of suitable plastics material, for example polyamide foils.

A solar cell module or a photovoltaic module (hereinafter termed solar cell module) comprises an individual solar cell or a planar arrangement of solar cells connected to one another, on a backing layer. Solar cell modules are typically encapsulated in order to protect the individual cells from the effect of disruptive influences. The mechanical reinforcement layer of a solar cell module here can by way of example take the form of transparent outer layer. However, it is equally possible to provide the mechanical reinforcement layer on the reverse side of the solar cell module. These two possibilities are also often combined with one another in such a way that solar cell modules comprise a mechanically stabilizing outer layer and a mechanically stabilizing substrate.

Series of solar cell modules are often connected to one another in order to form what are known as solar arrays. Here, a plurality of solar cell modules are connected to one another in such a way as to produce suitable voltages for supplying electrical systems with the voltage required.

Solar cell modules are generally produced via electrical connections of the individual solar cells to one another and lamination of the resultant connected cells between an outer layer and a substrate. The manner in which this lamination is carried out not only ensures that the solar cell module has adequate mechanical stability but also provides protection to same from environmental influences such as wind, snow, rain, soiling, and the like.

Waver-based solar cell modules are typically produced with a transparent outer layer generally fixed by means of an adhesive layer. The light therefore passes through both the upper layer and the adhesive layer before it encounters the semiconductor surface of the waver. The reverse-side mechanical protection layer is likewise secured on the reverse side of the waver with one or more layers of an encapsulation material.

The prior art discloses a large number of different encapsulation materials for solar cell modules: by way of example, ethylene-vinyl acetate copolymers (EVA), Tedlar® from Dupont, and thermoplastic polyurethane foils are used, as also are UV-curable urethanes. The encapsulation materials are typically used as film in order to laminate the abovementioned components of the solar cells to one another. The abovementioned materials, and also process methods, are described by way of example in U.S. Pat. No. 4,331,494. There are also known acrylate-based polymers for the production of weather-resistant layers, as described by way of example in U.S. Pat. No. 4,374,995. Another known method used for solar cell modules is application and hardening of acrylate-based prepolymers. This is described by way of example in U.S. Pat. No. 4,549,033. U.S. Pat. No. 6,320,116 and EP 0 406 814 A1 disclose other encapsulation systems for solar cells or photovoltaic systems.

WO 2009/007786 A2 moreover describes a lamination adhesive which includes a siloxane-based prepolymer. Use of this type of adhesive produces a silicone resin film with which the semiconductor material and the outer layers are connected to one another.

WO 2005/006451 A1 discloses a similar material. This laid-open specification describes an encapsulation material for solar cells which comprises a liquid diorganopolysiloxane having at least two silicon-alkenyl groups per molecule. This prepolymer is applied to the solar cell components that are to be connected to one another, and is hardened thermally or by way of infrared radiation.

The abovementioned procedure are attended by various disadvantages: the abovementioned foils made of ethylene-vinyl acetate and used for the production of laminates for solar modules are first inserted between the layers to be adhesive-bonded. This layer structure is then heated to about 140° C. for up to 40 minutes in vacuo in order to achieve adequate joint strength. The EVA foil melts here and, after cooling, fixes the layer composite. Firstly, this vacuum-based process is complicated, and secondly heating of the solar cell module to 140° C. places the semiconductor elements under stress which can adversely affect the durability and efficiency of the solar cells. Siloxane-containing adhesives are comparatively expensive, and do not have adequate adhesion on all substrates.

U.S. Pat. No. 8,034,455 B2 describes the use of UV-curable compositions which can be used for the coating of solar modules. U.S. Pat. No. 8,034,455 B2 does not indicate whether or how UV-curable compositions can be used for the adhesive bonding of solar modules in such a way that adequate adhesion between individual layers is also achieved in shaded regions.

On the basis of the abovementioned prior art, the object of the present invention consisted in providing a resin composition which is suitable for the production of solar laminates in a continuous process amenable to easy implementation, where the resin composition leads to good adhesion in all regions between the individual layers of the solar laminates.

The invention achieves said object via the use of a radiation-curable resin composition comprising at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A) and comprising at least one polyol (component B) for the production of solar laminates.

For the purposes of this invention, "(meth)acrylate" refers to appropriate acrylate or methacrylate functions, or to a mixture of the two.

The indefinite article "a" or "an" does not imply any numerical limitation but instead means "at least one", unless that meaning is explicitly excluded.

For the purposes of the present invention, radiation-curing groups are functional groups which react via polymerization when exposed to actinic radiation. The expression actinic radiation means electromagnetic, ionizing radiation, in particular electron beams, UV radiation, and also visible light (Roche Lexikon Medizin [Roche encyclopedia of medicine], $4^{th}$ edition; Urban & Fischer Verlag, Munich 1999). For the purposes of the present invention, the expression groups reacting with ethylenically unsaturated compounds via polymerization when exposed to actinic radiation (radiation-curing groups) means vinyl, propenyl, allyl, vinyl ether, maleyl, fumaryl, maleimide, dicyclopentadienyl, acrylamide, and (meth)acrylate groups, these preferably being vinyl ether and/or (meth)acrylate groups, and particularly preferably being (meth)acrylate groups.

Surprisingly, it has been found that heating during the lamination step can be omitted when a radiation-curable resin composition of the abovementioned type is used, and that the joining of the different components is thus markedly simplified: the compositions used in the invention can by way of example be processed at room temperature, thus not only saving thermal energy but also eliminating the stress to which the solar cell modules are subjected through high-temperature heating during the production process.

The resin composition used in the invention can by way of example be hardened via exposure to actinic radiation, and if necessary also via thermal activation. To this end, an appropriate initiator is added as component E) to the composition and, in the desired method, is capable of initiating a polymerization in particular of the double bonds of components C) and/or D). The substances and usage quantities required for this are known to the person skilled in the art. If high-energy radiation such as electron beam is to be used, there is generally no need to add an initiator.

In one preferred embodiment, the present invention therefore also provides the use of a radiation-curable resin composition comprising at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A) and comprising at least one polyol (component B), at least one unsaturated urethane acrylate which bears no isocyanate groups (component C), and at least one (meth)acrylate component (component D), for the production of solar laminates.

In one particularly preferred embodiment, the present invention therefore also provides the use of a radiation-curable resin composition comprising at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A) comprising at least one polyol (component B), at least one unsaturated urethane acrylate which bears no isocyanate groups (component C), at least one (meth)acrylate component (component D), and at least one initiator (component E), for the production of solar laminates.

It is preferable that the resin composition used in the invention is free from solvents with boiling point <150° C., in particular <200° C. This means that at most traces of substances of this type are present, for example at most 0.5% by weight, based on the resin composition, in particular at most 0.1% by weight.

The isocyanate-functional compounds that can be used in the invention are by way of example composed of polyisocyanates, where a portion of the NCO groups originally present has been reacted with hydroxy-functional compounds which have functional groups selected from the group consisting of vinyl, propenyl, allyl, vinyl ether, maleyl, fumaryl, maleimide, dicyclopentadienyl, acrylamide, and (meth)acrylate groups, so that the isocyanate-functional compound bears vinyl, propenyl, allyl, vinyl ether, maleyl, fumaryl, maleimide, dicyclopentadienyl, acrylamide, and/or (meth)acrylate groups, and also isocyanate groups.

Polyisocyanates used are typically aromatic, aliphatic, and cycloaliphatic polyisocyanates with number-average molar mass below 800 g/mol. Examples of suitable compounds are diisocyanates from the group of toluene 2,4-/2,6-diisocyanate (TDI), methylenediphenyl diisocyanate (MDI), triisocyanatononane (TIN), naphthyl diisocyanate (NDI), 4,4'-diisocyanatodicyclohexylmethane, 3-isocyanatomethyl-3,3,5-trimethylcyclohexyl isocyanate (isophorone diisocyanate=IPDI), tetramethylene diisocyanate, hexamethylene diisocyanate (HDI), 2-methylpentamethylene diisocyanate, 2,2,4-trimethylhexamethylene diisocyanate (THDI), dodecamethylene diisocyanate, 1,4-diisocyanatocyclohexane, 4,4'-diisocyanato-3,3'-dimethyldicyclohexylmethane, 4,4'-diisocyanato-2,2-dicyclohexylpropane, 3-isocyanatomethyl-1-methyl-1-isocyanatocyclohexane (MCI), 1,3-diisooctylcyanato-4-methylcyclohexane, 1,3-diisocyanato-2-methylcyclohexane, and α,α,α',α'-tetramethyl-m- or -p-xylylene diisocyanate (TMXDI) and also mixtures composed of these compounds.

Preferred starting materials for the production of the isocyanate-functional compounds are hexamethylene diisocyanate (HDI), isophorone diisocyanate (IPDI), and/or 4,4'-diisocyanato-dicyclohexylmethane.

Equally suitable polyisocyanates are products of reaction between identical or different isocyanates within those mentioned above, to give uretdiones, or to give isocyanurates. By way of example, mention may be made of Desmodur® N3300, Desmodur® N3400, or Desmodur® N3600 (all from Bayer MaterialScience, Leverkusen, Del.). Derivatives of isocyanates are moreover also suitable, for example allophanates or biurets. By way of example, mention may be made of Desmodur® N100, Desmodur® N75MPA/BA, or Desmodur® VPLS2102 (all from Bayer MaterialScience, Leverkusen, Del.).

Examples of hydroxylated compounds which have radiation-curing groups are 2-hydroxyethyl (meth)acrylate, polyethylene oxide mono(meth)acrylate (e.g. PEA6/PEM6; Laporte Performance Chemicals Ltd., UK), polypropylene oxide mono(meth)acrylate (e.g. PPA6, PPM5S; Laporte Performance Chemicals Ltd., UK), polyalkylene oxide mono(meth)acrylate (e.g. PEM63P, Laporte Performance Chemicals Ltd., UK), poly(ε-caprolactone) mono(meth)acrylates such as Tone M100® (Dow, Schwalbach, Del.), 2-hydroxypropyl (meth)acrylate, 4-hydroxybutyl (meth)acrylate, hydroxybutyl vinyl ether, 3-hydroxy-2,2-dimethylpropyl (meth)acrylate, the hydroxy-functional mono-, di-, or where possible higher acrylates such as glycerol di(meth)acrylate, trimethylolpropane di(meth)acrylate, pentaerythritol tri(meth)acrylate, or dipentaerythritol penta(meth)acrylate, these being obtainable via reaction of polyhydric optionally alkoxylated alcohols such as trimethylolpropane, glycerol, pentaerythritol, and dipentaerythritol.

Other compounds which can also be used as these OH-functional compounds which have radiation-curing groups, in the urethanization reaction, are the reaction products of acids containing double bonds with epoxy compounds optionally containing double bonds, for example the reaction products of (meth)acrylic acid with glycidyl (meth)acrylate or bisphenol A diglycidyl ether.

It is preferable that the isocyanate-functional compound which has at least one radiation-curing group selected from the group consisting of vinyl ether, maleyl, fumaryl, maleimide, dicyclopentadienyl, acrylamide, and (meth)acrylate groups is an isocyanate-functional urethane acrylate. The expression urethane acrylate means compounds which have at least one isocyanate group and at least one acrylate group per molecule. Systems of this type are known per se and are capable of polymerization both by way of an NCO/OH reaction with polyols or polyamines and by way of the acrylate function, by means of UV light or electron beam, by a free-radical route. Since these compounds have two different polymerization mechanisms, compositions comprising compounds of this type are also termed "dual-cure" systems.

The isocyanate-functional urethane acrylates that can be used in the invention are by way of example composed of polyisocyanates where a portion of the NCO groups originally present has been reacted with hydroxy-functional acrylates or methacrylates, so that the molecule bears terminal (meth)acrylate groups, and also isocyanate groups.

Monomeric di- or triisocyanates can be used here as starting compound for isocyanate-functional urethane acrylates. Examples of suitable monomeric polyisocyanates are naphthylene 1,5-diisocyanate, diphenylmethane 2,2'-, 2,4-, and/or 4,4'-diisocyanate (MDI), hydrogenated MDI (H12MDI), xylylene diisocyanate (XDI), tetramethylxylylene diisocyanate (TMXDI), diphenyldimethylmethane 4,4'-diisocyanate, dibenzyl 4,4'-diisocyanate, phenylene 1,3-diisocyanate, phenylene 1,4-diisocyanate, tolylene diisocyanate (TDI), 1-methyl-2,4-diisocyanatocyclohexane, 1,6-diisocyanato-2,2,4-trimethylhexane, 1,6-diisocyanato-2,4,4-trimethylhexane, 1-isocyanatomethyl-3-isocyanato-1,5,5-trimethylcyclohexane (IPDI), tetramethoxybutane 1,4-diisocyanate, hexane 1,6-diisocyanate (HDI), dicyclohexylmethane diisocyanate, cyclohexane 1,4-diisocyanate, ethylene diisocyanate, trimethylhexamethylene diisocyanate, 1,4-diisocyanatobutane, 1,12-diisocyanatododecane, dimer fatty acid diisocyanate or uretdione-, biuret-, or isocyanurates of diisocyanates. It is also possible to use isocyanate trimers as described by way of example in EP 1 002 818 B1, the disclosure of which is incorporated by reference into the present application.

Hydroxy-functional acrylates or methacrylates used are in principle any of the possible compounds of this type. The compounds comprise at least a monofunctional hydroxy-functional ester of (meth)acrylic acid. These can be either an ester of acrylic acid or methacrylic acid with dihydric alcohols which has a free hydroxy group, for example 2-hydroxyethyl, 2- or 3-hydroxypropyl, or 2-, 3-, or 4-hydroxybutyl (meth)acrylate, or else any desired mixture of compounds of this type. It is moreover also possible to use monohydric alcohols having (meth)acryloyl groups, or reaction products which consist essentially of alcohols of this type, being obtained via esterification of n-hydric alcohols with (meth)acrylic acid, where alcohols used can also be a mixture of various alcohols, in such a way that n is an integer or, being a statistical average, a non integer and in either case is from more than 2 to 4, preferably 3, where the quantity of (meth)acrylic acid used per mole of the alcohols mentioned is (n−0.8) to (n−1.2), preferably (n−1). Among these compounds or product mixtures are by way of example the reaction products of glycerol, trimethylolpropane, and/or pentaerythritol, of low-molecular-weight alkoxylation products of alcohols of that type, for example of ethoxylated or propoxylated trimethylolpropane, for example of the adduct of ethylene oxide onto trimethylolpropane having the OH number 550, or of any desired mixture of at least trihydric alcohols of that type with dihydric alcohols, for example ethylene glycol or propylene glycol with (ii) (meth)acrylic acid in the molar ratio mentioned.

Production of urethane acrylates that can be used in the invention is equally possible by starting from a polymeric compound selected from the group consisting of polyester (meth)acrylates, polyether (meth)acrylates, polyetherester (meth)acrylates, unsaturated polyesters having allyl ether structural units, and polyepoxy (meth)acrylates. This polymeric compound forms the main structure of the polymer, and is reacted with polyisocyanates to produce the urethane acrylate. The isocyanate groups of the resultant urethane acrylates can then in turn, if desired, be reacted with monomeric compounds having respectively a hydroxy function and at least one (meth)acrylate group, thus producing terminal acrylate groups. If only a portion of the isocyanate groups is reacted, isocyanate-functional urethane acrylates are obtained. If the isocyanate groups are fully reacted, an unsaturated urethane acrylate is produced.

In a particular embodiment of the resin composition used in the invention, the NCO functionality of the isocyanate-functional urethane acrylate is from 0.8 to 6, preferably from 1 to 4, more preferably from 1.2 to 3, very particularly preferably from 1.5 to 2.5, and in particular 2. This is particularly advantageous because it is possible thus to produce good adhesion on a very wide variety of materials such as plastics, metals, and glass.

The double-bond functionality of the isocyanate-functional urethane acrylate can vary widely. It is preferable that the double-bond functionality is from 0.5 to 6, with preference from 1 to 4, with more preference from 1.5 to 3. The double-bond functionality is defined here as statistical average number of double bonds per molecule of the isocyanate-functional urethane acrylate.

It is further preferable that the average molecular weight of the isocyanate-functional urethane acrylate is from 150 to 5000, in particular from 300 to 2500.

The resin composition used in the invention moreover comprises at least one polyol (component B). For this purpose, any polyol known in the prior art by way of example for the production of polyurethane polymers can be used. Compounds that can be used for this purpose are in particular polyether polyols, polyester polyols, polyether polyester polyols, polycarbonate polyols, polyester carbonate polyols, or polyether carbonate polyols. Other examples are aliphatic alcohols and polyols having from 1 to 6 OH groups per molecule and from 2 to about 30 carbon atoms. Examples of suitable aliphatic polyols are ethylene glycol, 1,2 or 1,3-propanediol, 1,4-butanediol, 1,3-butanediol, 2,3-butanediol, 1,4-butenediol, 1,5-pentanediol, pentenediols, 1,6-hexanediol, 1,8-octanediol, dodecanediol, and higher homologues, isomers, and mixtures of compounds of that type. Equally suitable are higher-functional alcohols such as glycerol, trimethylolpropane, pentaerythritol, or sugar alcohols, such as sorbitol or glucose, and also oligomeric ethers, or reaction products with ethylene oxide or with propylene oxide. It is moreover possible to use what are known as polyether polyols: the reaction products of low-molecular weight, polyhydric alcohols with alkylene oxides. It is preferable that the alkylene oxides have from two to about four carbon atoms. Examples of suitable compounds are the reaction products of ethylene glycol, propylene glycol, glycerol, trimethylolethane, or trimethylolpropane, or pentaerythritol with ethylene oxide, propylene oxide, or butylene oxide, or with a mixture thereof. The alcohols mentioned here can themselves also be "dual-functional", i.e. can also have unsaturated double bonds and hydroxy groups, where the double bond can by way of example be obtained via partial esterification with acrylic acid or reaction with di- or polyisocyanates and further reaction—as described above—with hydroxy-functional compounds containing a double bond.

The molar mass of the polyols can vary widely. It is preferable that the molar mass ($M_N$) of the polyols is about 50 to 5000 g/mol (number-average molar mass, $M_N$, as can be determined by GPC), in particular from 150 to 2500 g/mol. Polyols of this type are known to the person skilled in the art and are obtainable commercially.

In particular, the polyol features an OH functionality of from 1 to 6, preferably from 1.5 to 5, more preferably from 1.7 to 4, particularly preferably from 1.8 to 3.5, and very particularly preferably 2.

The present invention provides that the resin composition optionally comprises an unsaturated urethane acrylate (component C). This therefore differs from the isocyanate-functional urethane acrylate in that it bears no free NCO groups. The unsaturated urethane acrylates used in the invention are, as also are the isocyanate-functional urethane acrylates, composed of a polyfunctional isocyanate, and in the case of the unsaturated urethane acrylates here all of the isocyanate groups have been reacted with a hydroxy-functional acrylate or methacrylate. It is also possible to use the alternatives described in the context of the isocyanate-functional urethane acrylates above, having a polymeric backbone made of polyester (meth)acrylates, of polyether (meth)acrylates, of polyetherester (meth)acrylates, of unsaturated polyesters having allyl ether structural units, and of polyepoxy (meth)acrylates.

With reference to the polyfunctional isocyanates that can be used for the unsaturated urethane acrylates, it is possible to use, for these, compounds that are in principle the same as those stated above in the context of the isocyanate-functional urethane acrylates.

It is preferable that the polyfunctional isocyanates for the unsaturated urethane acrylates are selected from the aliphatic polyfunctional isocyanates. In other words, preference is therefore given to an unsaturated aliphatic urethane acrylate as component C). Particular preference is given to these compounds because they improve the flexibility, after hardening, of the composition used in the invention. This is of particularly high importance in the use as lamination adhesive for in the case of solar cells, because there is a resultant increase in capability to resist impact and shock. The improved flexibility moreover prevents delamination of the individual layers of the solar cell caused by stress resulting from constantly changing temperature.

In another embodiment of the invention, the unsaturated urethane acrylate comprises a proportion of OH groups. The OH functionality is generally small, and can by way of example be from 0.01 to 1, preferably from 0.05 to 0.8, more preferably from 0.08 to 0.6, very particularly preferably from 0.09 to 0.5, and in particular 0.1. These OH groups are likewise available for a reaction with NCO groups.

It is further preferable that the average molecular weight of the unsaturated urethane acrylate is from 200 to 3000, in particular from 300 to 2000.

The double-bond functionality of the unsaturated urethane acrylate can vary widely. It is preferable that the double-bond functionality is from 1 to 6, with preference from 2 to 5, with further preference from 2.5 to 4. The double-bond functionality is defined here as statistical average number of double bonds per molecule of the unsaturated urethane acrylate.

Another feature of the resin compositions used in the invention is the optional presence of a (meth)acrylate component (component D). This (meth)acrylate component can be selected from aliphatic and/or aromatic methacrylates. Alkyl (meth)acrylates that can be used are by way of example linear or branched monofunctional unsaturated (meth)acrylates of non-tertiary alkyl alcohols in which the alkyl groups have from 4 to 14 carbon atoms, and in particular from 4 to 12. Examples of these lower alkyl acrylates are n-butyl, n-pentyl, n-hexyl, cyclohexyl, isoheptyl, n-nonyl, n-decyl, isohexyl, isobornyl, 2-ethyloctyl, isooctyl, 2-ethylhexyl, tetrahydrofurfuryl, ethoxyethoxyethyl, phenoxyethyl, cyclotrimethylpropane, 3,3,5-trimethylcyclohexyl, tert-butylcyclohexyl, tert-butyl acrylates, and the corresponding methacrylates. Preferred alkyl acrylates are isooctyl acrylate, 2-ethylhexyl acrylate, 2-ethyloctyl acrylate, n-butyl acrylate, tetrahydrofurfuryl acrylate, isobornyl acrylate, ethoxyethoxyethyl acrylate, phenoxyethyl acrylate, 3,3,5-trimethylcyclohexyl acrylate, and also cyclohexyl acrylate.

In another preferred embodiment of the resin composition used in the invention, component E is selected from the group comprising UV initiators, thermally activatable initiators, and redox initiators.

Examples of photoactivatable initiators that can be used are benzoin ethers, such as benzoin methyl ether, benzoin isopropyl ether, substituted benzoin ether, such as anisoinmethyl ether, acetophenones, such as 2,2-diethoxyacetophenone, substituted acetophenones, such as 2,2-diethoxyacetophenone, 2,2-dimethoxy-2-phenylacetophenone, and 1-phenyl-2-hydroxy-2-methyl-1-propanone, substituted alpha-ketols, such as 2-methyl-2-hydroxypropiophenone, aromatic sulfonyl chlorides, and photoactive oximes, such as 1-phenyl-1,1-propanedione-2-(O-ethoxycarbonyl) oxime.

Organic peroxides can be used as thermally activatable initiators, examples being di-tert-butyl peroxide, benzoyl peroxide, and lauryl peroxide, and also 2,2'-azobis(isobutyronitrile).

The usage quantities of the abovementioned initiators are known in principle to the person skilled in the art, and by way of example are about 0.01 to 8% by weight, in particular from 0.5 to 5% by weight, preferably from 1 to 3% by weight.

The composition used in the invention can moreover also include conventional additives. Examples of those that can be used for this purpose are the following, known to the person skilled in the art: fillers, stabilizers, in particular UV stabilizers, fungicides, dyes, pigments, polymerization catalysts, plasticizers, and solvents. By way of example, isocyanate addition catalysts known per se can be used as polymerization catalysts, an example being triethylamine, 1,4-diazabicyclo[2.2.2]octane, tin dioctoate, dibutyltin dilaurate, or bismuth octoate.

In one particularly preferred embodiment of the resin composition used in the invention, this comprises the following quantities of the components:

Component A) from 10 to 79.9% by weight, in particular from 15 to 75% by weight,
Component B) from 20 to 89.9% by weight, in particular from 25 to 85% by weight,
Component C) from 0 to 50% by weight, in particular from 15 to 30% by weight,
Component D) from 0 to 35% by weight, in particular from 10 to 25% by weight, and
Component E) from 0.1 to 8% by weight, in particular from 0.5 to 5% by weight.

The use of this composition is particularly preferred because it is particularly suitable for the production of solar laminates: this composition combines good adhesion on the substrates typically used, has high long-term resistance to environmental influences, is sufficiently flexible to compensate stresses in the laminate, and moreover is amenable to easy and rapid processing.

A feature of a resin composition to which further preference is given in the present invention is that components A) and B) can in principle be stored separately from one another, with admixture of C), D), and also optionally E) in a premix if necessary to components A) and B).

The present invention further provides a process for the production of a solar laminate comprising at least one solar cell with a frontal side, a reverse side, and reverse-side contacts there attached.

The present invention further provides a process for the production of a solar laminate comprising at least one solar cell with a frontal side, a reverse side, and reverse-side contacts there attached, and comprising a glass pane, and also comprising a reverse-side foil, where the process includes the following steps:
a) application of a radiation-curable resin composition as defined above onto the reverse-side foil and the glass pane of the solar module,
b) hardening of the coatings by means of actinic radiation,
c) bringing the frontal side of the solar cell into contact with the resin layer produced on the glass pane,
d) bringing the reverse side of the solar cell into contact with the resin layer produced on the reverse-side foil,
e) passing the reverse-side contacts of the solar cell through the reverse-side foil,
f) introduction of the resultant layer composite into a vacuum laminator for the removal of included air, and
g) partial hardening of the remaining isocyanate and OH functionalities of the resin composition in the vacuum laminator under reduced atmospheric pressure, with effective adhesive bonding of frontal and reverse side of the solar element and encapsulation of the solar cell.

An advantage of the processes of the invention is that the lamination process does not require any high temperatures. There is therefore no requirement that the solar module be subjected to any long-lasting thermal stress before conclusion of the lamination process.

The present invention further provides a process for the production of a solar laminate comprising at least one solar cell with a frontal side, a reverse side, and reverse-side contacts there attached, and comprising a glass pane, and also comprising a reverse-side foil, where the process includes the following steps:
a) application of a radiation-curable resin composition as defined above onto the reverse-side foil of the solar module,
b) hardening of the coatings by means of actinic radiation,
c) bringing the reverse side of the solar cell into contact with the resin layer produced on the reverse-side foil,
d) passing the reverse-side contacts of the solar cell through the reverse-side foil,
e) application of a radiation-curable resin composition onto the frontal side of the solar laminate obtained after step d),
f) bringing the frontal side of the solar cell into contact with the glass pane,
g) introduction of the resultant layer composite into a vacuum laminator,
h) partial hardening of the remaining isocyanate and OH functionalities of the resin composition in the vacuum laminate under reduced atmospheric pressure,
i) after discharge from the laminator, hardening of the remaining double bonds of the resin composition of the invention by actinic radiation via the frontal glass pane primed with groups having free-radical reactivity, and
j) adhesive bonding of the glass pane with the resin matrix and encapsulation of the solar cell.

In the processes of the invention, the hardening of the polyurethane resin composition advantageously takes place via exposure to actinic radiation, such as UV radiation, gamma radiation, or electron beam, and a polymerization reaction that proceeds independently by way of a reaction of OH groups with the NCO groups.

The present invention further provides a process for the production of a solar laminate comprising at least one solar cell with a frontal side, a reverse side, and reverse-side contacts there attached, and comprising a glass pane, and also comprising a reverse-side foil, where the process includes the following steps:
a) application of an adhesive onto the reverse-side foil and/or the reverse side of the solar cell,
b) bringing the reverse side of the solar cell into contact with the reverse-side foil, and adhesive bonding of these,
c) passing the reverse-side contacts of the solar cell through the reverse-side foil,
d) application of a radiation-curable resin composition as defined above onto the frontal side of the solar laminate obtained after step c),
e) hardening of the resin composition by means of actinic radiation,
f) optionally protection by a further frontal-side foil or a glass pane, in a vacuum-lamination process, of the flat-encapsulated cell obtained after e), and g) optionally protection, via one or more further coatings, of the flat-encapsulated cell obtained after e).

It is preferable that the reverse side of the solar cell is adhesive-bonded to a suitable glass pane or reverse-side foil that has been prepared or, in accordance with well-known methods, has been surface-cleaned, activated, and equipped with adhesion-promoting properties, or to any other substrate that provides stability and adequate protection from environmental influences. Well-known adhesives that are resistant to temperature change and to weathering are suitable as adhesive, examples being reactive hot-melt adhesives, heat-activatable adhesive dispersions, and also acrylate- or silicone-based PVA and PSA adhesives. The adhesive here can be applied to the solar cell or else to the foil or to the substrate. The frontal side of the resultant solar cell structure is then coated with the composition used in the invention, where this produces a flat or specifically structured surface. The coated solar cell is then treated with actinic radiation, electron beam, or heat. The resultant solar cell can optionally be adhesive-bonded to a glass pane or to a transparent foil by way of example in a vacuum lamination oven, or can be provided with one or more further coating. For full hardening, the resultant encapsulated solar cell is stored for from 10 to 72 h at room temperature. For accelerated hardening, it is also possible to use storage at higher temperatures up to 120° C.

In one particular embodiment, the resin formulation used in the invention is also used for the adhesive bonding of the reverse side of the solar cell.

An advantage in comparison with coatings that crosslink exclusively by a free-radical route (UV) is that the process of the invention achieves lower shrinkage, and also achieves reliable hardening of the coating in shaded zones, this being particularly important for the long-term robustness of the elements because uncured monomeric constituents in the shaded region can migrate, can cause blistering, and can sometimes cause separation of the coating.

The present invention further provides a solar laminate which can be produced by a process of the invention.

The invention further provides a solar laminate which comprises a resin composition used in the invention.

EXAMPLES

The present invention is explained in more detail below with reference to an inventive example:

The following chemicals were used in the inventive example:

Desmophen® C 1100: Linear aliphatic polycarbonate polyester, Bayer Material Science, Leverkusen (Germany), Desmolux® XP 2513: Unsaturated aliphatic urethane acrylate, Bayer Material Science, Leverkusen (Germany), Desmolux® VP LS 2396: Isocyanate-functional urethane acrylate, Bayer Material Science, Leverkusen (Germany), IBOA: Isobornyl acrylate, Evonik Irgacure® 2959: UV initiator, BASF AMEO® T Adhesion promoter from Evonik A resin composition of the invention was produced by firstly producing two components that are to be mixed with one another immediately prior to use. The first component comprises the following constituents:

| Component | Mass (g) | % by weight |
|---|---|---|
| Desmophen® C 1100 | 51.5 | 25.5 |
| Desmolux® XP 2513 | 65.0 | 27.7 |
| IBOA | 32.7 | 16.2 |
| Irgacure® 2959 | 5.9 | 2.9 |

In the production of this first component, the Irgacure® 2959 is first dissolved in the isobornyl acrylate (IBOA), and is then mixed with the other components.

The second component is composed only of the isocyanate-functional urethane acrylate:

| Component | Mass (g) | % by weight |
|---|---|---|
| Desmolux® VP LS 2396 | 56.0 | 27.7 |

A solar laminate is produced by carefully mixing the two components with one another and applying them to the reverse-side foil. The resultant coating is cured by actinic radiation. The solar cell is then placed onto the reverse-side foil, and cast with further resin formulation, the reverse-side contacts of the solar cell being passed through appropriate cutouts provided in the reverse-side foil. The glass pane, primed with a suitable adhesion promoter (e.g. with aminosilane (AMEO® T from Evonik)) on the side facing toward the cell, is placed onto this layer composite, and the structure is then transferred into a vacuum lamination apparatus which evacuates any air present, thus achieving complete removal of air inclusions between the adhesive layers and the components, and is then hardened with the aid of a UV arc lamp.

The hardening process gives a solar module which has good mechanical stability, is resistant to weathering influences, and at the same time is easy to produce. The solar module can also be obtained in a continuous process.

What is claimed is:

1. A process for the production of solar laminates including the step of utilizing a radiation-curable resin composition comprising at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A), and at least one polyol (component B).

2. The process as claimed in claim 1, wherein the radiation-curable composition comprises at least one unsaturated urethane acrylate which bears no isocyanate groups (component C) and at least one (meth)acrylate component (component D).

3. The process as claimed in claim 2, wherein a double-bond functionality of the unsaturated urethane acrylate which bears no isocyanate groups (component C) is from 1 to 6.

4. The process as claimed in claim 2, wherein the unsaturated urethane acrylate which bears no isocyanate groups (component C) is an unsaturated aliphatic urethane acrylate.

5. The process as claimed in claim 2, wherein the (meth)acrylate component (component D) is selected from the group consisting of isobornyl (meth)acrylate, tetrahydrofurfuryl acrylate, 2-ethyloctyl acrylate, 2-ethylhexyl acrylate, and ethoxyethoxyethyl acrylate.

6. The process as claimed in claim 1, wherein the isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups is an isocyanate-functional urethane acrylate.

7. The process as claimed in claim 6, wherein the NCO functionality of the isocyanate-functional urethane acrylate is from 0.8 to 6.

8. The process as claimed in claim 1, wherein the radiation-curable composition comprises at least one initiator (component E).

9. The process as claimed in claim 1, wherein the isocyanate-functional compound has (meth)acrylate groups.

10. The process as claimed in claim 1, wherein the radiation-curable resin composition is free from organic solvents with boiling point <150° C.

11. The process as claimed in claim 1, wherein the OH functionality of the polyol is from 1 to 6.

12. A solar laminate comprising a resin composition according to claim 1 comprising at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A), and at least one polyol (component B).

13. A process for the production of a solar laminate comprising at least one solar cell having a frontal side, a reverse side, and reverse-side contacts attached thereto, a glass pane, and a reverse-side foil, where the process comprises the following steps:
    a) application of a radiation-curable resin composition as claimed in claim 1 onto a reverse-side foil and a glass pane for attachment to a solar cell, wherein the radiation-curable resin composition comprises at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A), and at least one polyol (component B,
    b) hardening of the applied radiation curable resin composition by application of actinic radiation,
    c) bringing the frontal side of a solar cell into contact with the resin layer produced on the glass pane,
    d) bringing the reverse side of the solar cell into contact with the resin layer produced on the reverse-side foil,
    e) passing the reverse-side contacts of the solar cell through the reverse-side foil,
    f) introduction of the resultant layer composite formed by steps a) to e) into a vacuum laminator for the removal of included air, and
    g) partial hardening of the remaining isocyanate and OH functionalities of the resin composition in the vacuum laminator under reduced atmospheric pressure, with effective adhesive bonding of the frontal and reverse sides of the solar cell and encapsulation of the solar cell.

14. A solar laminate produced by a process as claimed in claim 13.

15. A process for the production of a solar laminate comprising at least one solar cell having a frontal side, a reverse side, and reverse-side contacts attached thereto, and a reverse-side foil, where the process comprises the following steps:
    a) application of a radiation-curable resin composition as claimed in claim 1 onto a reverse-side foil for attachment to a solar cell, wherein the radiation-curable resin composition comprises at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth)acrylate groups (component A), and at least one polyol (component B),
    b) hardening of the applied radiation curable resin composition by application of actinic radiation,
    c) bringing the reverse side of a solar cell into contact with the resin layer produced on the reverse-side foil,
    d) passing the reverse-side contacts of the solar cell through the reverse-side foil,
    e) application of a radiation-curable resin composition onto the frontal side of the solar laminate obtained after step d),
    f) bringing the frontal side of the solar cell into contact with a glass pane,
    g) introduction of the resultant layer composite into a vacuum laminator, and
    h) partial hardening of the remaining isocyanate and OH functionalities of the resin composition in the vacuum laminator under reduced atmospheric pressure, and
    i) after discharge from the laminator, hardening of the remaining double bonds of the resin composition by application of actinic radiation via the glass pane primed with groups having free-radical reactivity, and
    j) adhesive bonding of the glass pane with the resin matrix and encapsulation of the solar cell.

16. A solar laminate provided by a process as claimed in claim 15.

17. A process for the production of a solar laminate comprising at least one solar cell with a frontal side, a reverse side, reverse-side contacts attached thereto, and a reverse-side foil, where the process comprises the following steps:
    a) application of an adhesive onto a reverse-side foil and/or the reverse side of a solar cell,
    b) bringing the reverse side of the solar cell into contact with the reverse-side foil, and adhesive bonding of these,
    c) passing reverse-side contacts of the solar cell through the reverse-side foil,
    d) application of a radiation-curable resin composition as claimed in claim 1 onto the frontal side of the solar laminate obtained after step c) wherein the radiation-curable resin comprises at least one isocyanate-functional compound which has at least one radiation-curing group selected from the group consisting of vinyl, propenyl, allyl, vinyl ether, maleyl, fumaryl, maleimide, dicyclopentadienyl, acrylamide, and (meth) acrylate groups (component A), and at least one polyol (component B),
    e) hardening of the resin composition by application of actinic radiation,
    f) optionally protecting the flat-encapsulated cell obtained after step e) by application of a further frontal-side foil or a glass pane to the flat-encapsulated cell, using a vacuum-lamination process, and
    g) optionally protecting the flat-encapsulated cell obtained after step e) by application of one or more further coatings.

18. A solar laminate provided by a process as claimed in claim 17.

* * * * *